(12) United States Patent
Nguyen

(10) Patent No.: US 8,488,326 B2
(45) Date of Patent: Jul. 16, 2013

(54) MEMORY SUPPORT STRUCTURE

(75) Inventor: Vincent Nguyen, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 374 days.

(21) Appl. No.: 12/947,473

(22) Filed: Nov. 16, 2010

(65) Prior Publication Data
US 2012/0120582 A1 May 17, 2012

(51) Int. Cl.
H05K 7/00 (2006.01)

(52) U.S. Cl.
USPC .............................. 361/735; 361/790; 29/830

(58) Field of Classification Search
USPC .................................................. 361/735, 790
See application file for complete search history.

(56) References Cited

U.S. PATENT DOCUMENTS

| | | | |
|---|---|---|---|
| 5,963,431 A * | 10/1999 | Stancil | 361/803 |
| 5,966,289 A * | 10/1999 | Hastings et al. | 361/704 |
| 6,246,588 B1 | 6/2001 | Kim et al. | |
| 6,288,898 B1 * | 9/2001 | Johnson et al. | 361/679.49 |
| 6,324,075 B1 * | 11/2001 | Unrein et al. | 361/816 |
| 6,362,974 B1 * | 3/2002 | Lettang | 361/790 |
| 6,608,763 B1 | 8/2003 | Burns et al. | |
| 6,731,515 B2 * | 5/2004 | Rhoads | 361/796 |
| 7,075,797 B1 * | 7/2006 | Leonard et al. | 361/803 |
| 7,123,470 B2 * | 10/2006 | Hsu et al. | 361/679.02 |
| 7,200,023 B2 | 4/2007 | Foster | |
| 7,304,842 B2 * | 12/2007 | Yatskov | 361/679.48 |
| 7,468,884 B2 * | 12/2008 | Carr et al. | 361/679.41 |
| 7,499,285 B2 * | 3/2009 | Chen et al. | 361/752 |
| 7,787,251 B2 * | 8/2010 | Bailey | 361/719 |
| 8,164,907 B2 * | 4/2012 | Hannula et al. | 361/728 |
| 2007/0070608 A1 * | 3/2007 | Warren et al. | 361/735 |
| 2008/0002370 A1 * | 1/2008 | Lau et al. | 361/735 |

FOREIGN PATENT DOCUMENTS

EP 1065752 A1 1/2001

* cited by examiner

Primary Examiner — Lisa Lea Edmonds

(57) ABSTRACT

A memory support structure includes a base for physically and electrically connecting to a substrate. When so connected, the memory support structure extends orthogonal to the substrate to a height of at least 2.5 cm. The memory support structure provides at least three sockets for receiving and engaging memory modules so that they extend parallel to the substrate. The memory support structure also includes electrical pathways for electrically connecting the sockets and the base so that a memory module inserted into one of said sockets is electrically connected to the substrate.

9 Claims, 5 Drawing Sheets

MEMORY SUPPORT STRUCTURE

BACKGROUND

Blade and other modular computer systems offer limited space into which computer components such as central processing unit (CPU) assemblies (including heat sinks) and memory modules can be arranged, e.g., on a motherboard. If there are memory modules at different interconnect distances, the most distant memory modules can place a lower limit on memory bandwidth. On the other hand, close packing of memory modules can make routing more difficult, both between the CPU and the memory modules and between the CPU and other devices that the CPU accesses.

DETAILED DESCRIPTION

Figure 1:
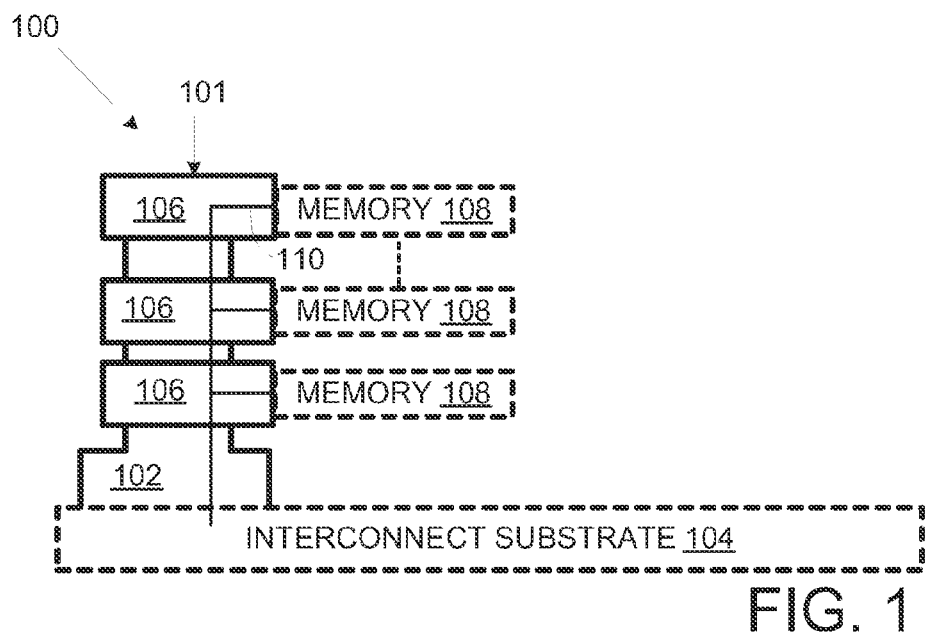
FIG. 1 is a schematic diagram of a memory support structure.
Figure 2:
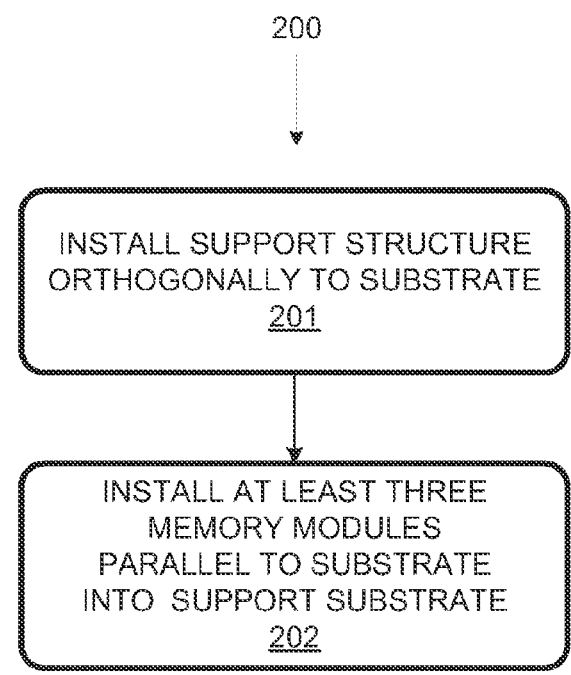
FIG. 2 is a flow chart of a process in accordance with an embodiment.

A system 100 includes a memory support structure 101, shown in FIG. 1. Memory support structure 101 includes a base 102 for connecting to a substrate 104, sockets 106 for engaging memory modules 108 upon installation, and electrical pathways 110 electrically connecting sockets 106 and said base 102 so that memory modules 108, when inserted into sockets 106, are electrically connected to substrate 104. A process 200, flow-charted in FIG. 2, provides for installing support structure 101 on substrate 104 so that support structure 101 extends vertically at least 2.5 centimeters (cm) therefrom. At process segment 202, memory modules are installed in sockets 106 so that the memory modules extend parallel to substrate 104 and so that at least one of the memory modules is at least 2.5 cm from the substrate.

Unlike memory bank modules that extend two-dimensionally along a substrate and hold memory modules orthogonal to the substrate, support structure 101 takes advantage of a third dimension to stack memory modules. Since less substrate area is consumed, other components can be arranged closer to a CPU assembly. Also, to the extent that shorter memory modules can be produced, the design of structure 101 can allow even closer spacing of components. Electrical connections between memory modules and a CPU can be short and direct so as to enhance system performance. In contrast to existing right-angle memory support structures, a greater height accommodates more memory modules and provides more volume for ventilation.

Figure 3:
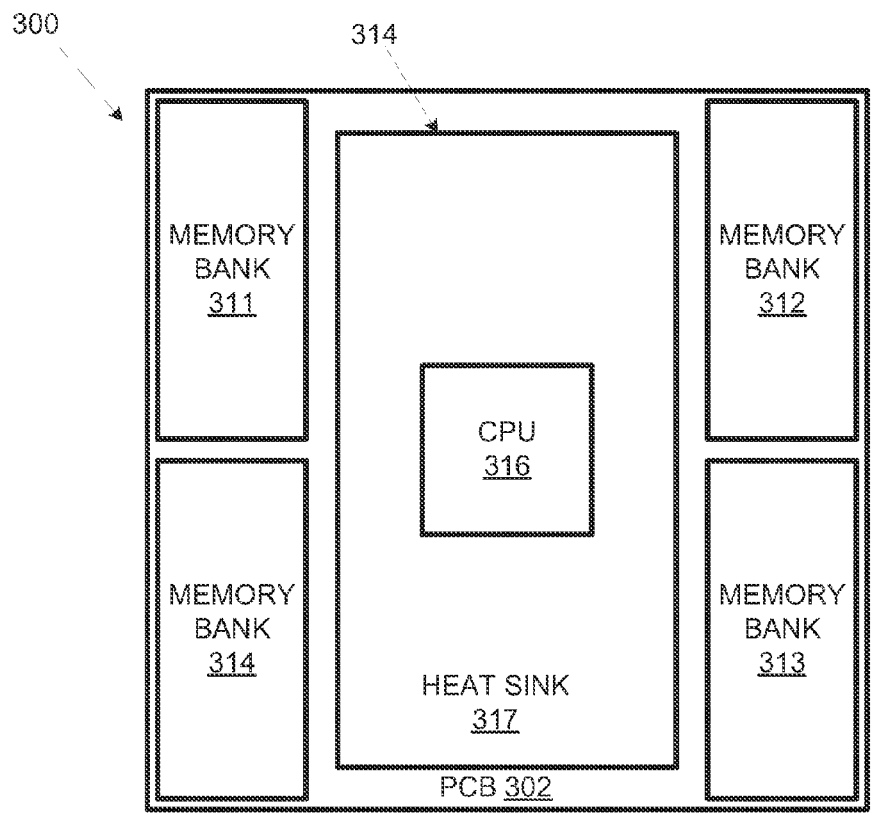
FIG. 3 is a schematic plan view of a computer (in accordance with an embodiment.

A computer node 300, shown in FIG. 3, includes a printed-circuit board 302 or other interconnect substrate, a CPU assembly 304, and memory bank modules 311-314. Computer node 300 can be the sole node of a computer system or one of plural computer nodes in a multi-processor computer system. In the latter case, shown in FIG. 4, computer node 300 can be one of two or more nodes sharing PCB 302, e.g., in a blade system. CPU assembly 304 can include a CPU 316 (FIG. 3), which can be single- or multi-core. In addition, CPU assembly 304 can include packaging for CPU 316 and a heat sink 317.

Figure 4:
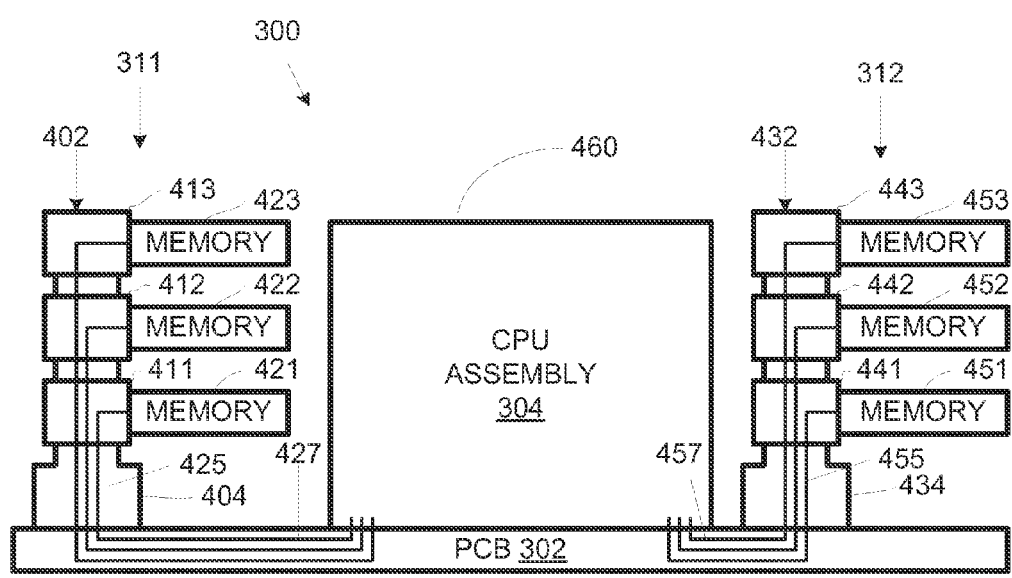
FIG. 4 is a schematic sectional view of a first variant of the node of FIG. 3.
Figure 5:
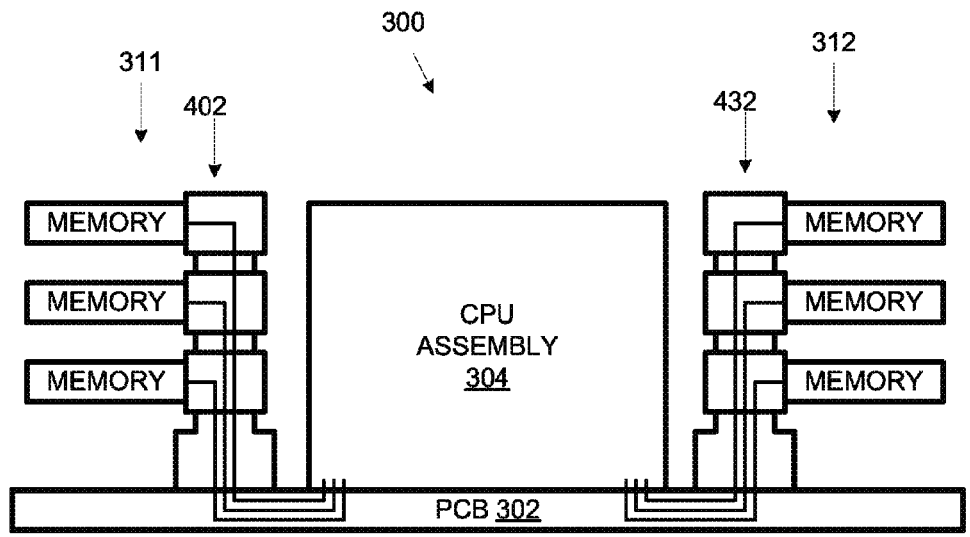
FIG. 5 is a schematic sectional view of a second variant of the node of FIG. 3.
Figure 6:
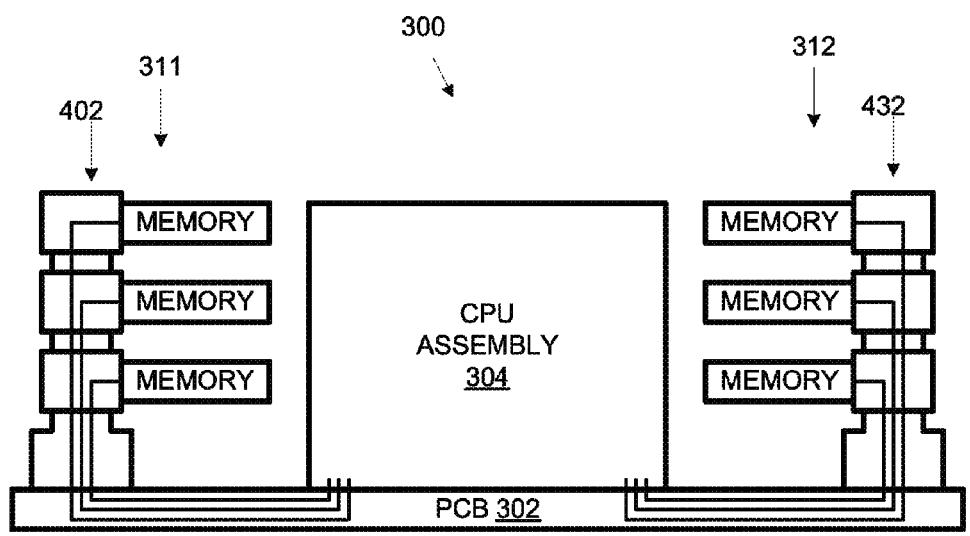
FIG. 6 is a schematic sectional view of a third variant of the node of FIG. 3.

FIGS. 4, 5, and 6 represent different arrangements of the components shown in FIG. 3. As shown in FIG. 4, memory bank 311 includes a memory support structure 402 having a base 404 and sockets 411, 412, and 413 for securing respective memory modules 421, 422, and 423. Memory support structure 402 is dimensioned so that its height above PCB 302 and the distance of a memory module installed in socket 413 are within 20% of the height of CPU assembly 304 (e.g., the top 460 of the heat sink) above PCB 302 since CPU assembly 304 and memory banks 311-314 are likely to be subject to the same height constraints. In this case, the height of memory support structure 402 is about 4.2 cm, e.g., between 4.0 cm and 4.6 cm. While support structure 402 holds up to three memory modules, other embodiments provide for holding up to four or more memory modules.

Base 404 provides for a surface mount connection to PCB 302. In other embodiments, other connection technologies are employed to install a memory support structure on a PCB. When installed, memory support structure 402 extends orthogonally (vertically, in the orientation of FIG. 4) from the plane of PCB 302. Sockets 411-413 are oriented so that (when memory support structure 402 is installed on PCB 302) memory modules 421-423 extend parallel to the plane of PCB 302, as shown in FIG. 4.

Memory support structure 402 includes electrical paths 425 for electrically connecting to electrical paths 427 of PCB 302 so that CPU 316 (FIG. 3) can access memory modules 421-423. In practice electrical paths 425 can define a common bus shared by sockets 411-413.

Memory banks 312-314 (FIG. 3) are connected in the same manner as memory bank 311. As shown in FIG. 4, memory bank 312 includes a support structure 432, a base 434, sockets 441-443 for holding memory modules 451-453. Support structure 432 extends orthogonally from PCB 302, while its memory modules 451-453 extend from sockets 441-443 parallel to PCB 302. Memory support structure 432 includes electrical paths 455 for electrically connecting to electrical paths 457 of PCB 302 so that CPU 316 (FIG. 3) can access memory modules 441-443.

Memory banks 311 and 312 are both oriented so that their memory modules 421-423 and 451-453 extend to the left in the representation of FIG. 4. Since memory banks 311 and 312 are on opposite sides of CPU assembly 304, memory modules 421-423 extend toward CPU assembly 304, whereas memory modules 451-453 extend away from CPU assembly 304. The opposing orientations relative to CPU assembly 304 have an impact on the lengths of electrical paths 427 and 457 used to connect memory modules to CPU assembly 304. As is apparent in FIG. 4, electrical paths 427 are longer than electrical paths 457.

In the variation depicted in FIG. 5, all memory banks, including banks 311 and 312 as shown, have memory modules, e.g. modules 421-423 and 451-453, oriented so that the memory modules extend away from CPU assembly 304. This arrangement provides for minimum lengths for pathways 427 and 457 over which. CPU 316 (FIG. 3) accesses banks 311 and 312. This in turn can lead to shorter memory access times and higher performance.

In the variation depicted in FIG. 6, all banks, including banks 311 and 312, as shown, are oriented so that their memory modules, e.g., memory modules 421-423 and 451-453, extend toward CPU assembly 304. This arrangement provides for room and thus routing flexibility about the heavily trafficked area near CPU 316 (FIG. 3). In the embodiment and variations of FIGS. 3-6, banks 311 and 314 are on the same side of CPU assembly 304, while banks 312 and 313 are on the opposite side. In the embodiment and variations of FIGS. 3-6, all memory banks are the same distance from the CPU. No memory banks are arranged behind other memory banks and connections are not ganged (serialized), which could limit performance.

Figure 7:
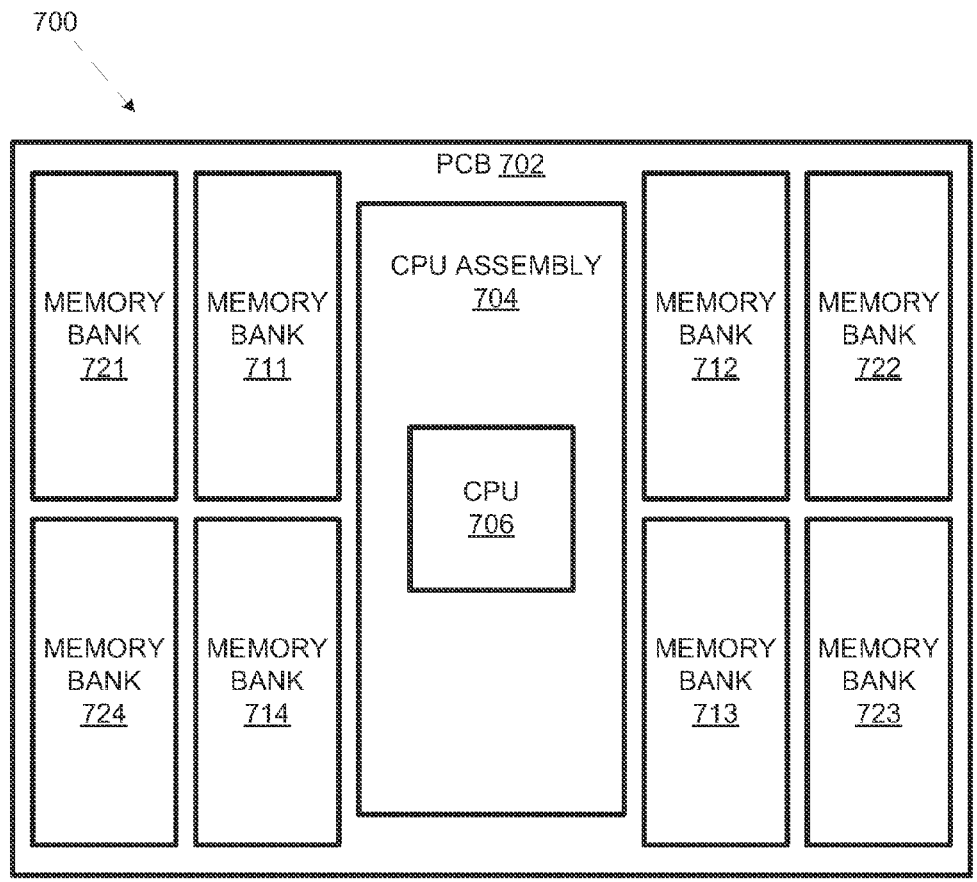
FIG. 7 is a schematic plan view of a computer node in which memory banks are arranged back to back in accordance with an embodiment.

A node 700, shown in FIG. 7, includes a PCB 702, a CPU assembly 704 including a CPU 706, and memory banks 711-714 and 721-724 (which may be the same as memory banks 321-324). Memory banks 721-724 are "behind" respective ones of memory banks 711-714, from the perspective of CPU assembly 704. In effect, memory banks are arranged in back-to-back pairs, as indicated for memory banks 712 and 721 in FIG. 8.

Figure 8:
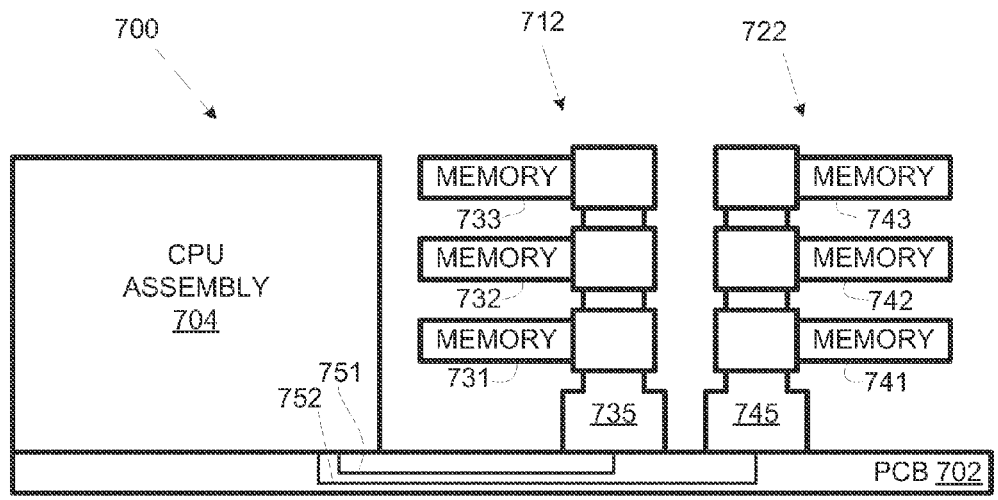
FIG. 8 is a schematic partial sectional view of the node of FIG. 7.

Memory modules 731-733, as shown in FIG. 8, extend from memory support structure 735 of memory bank 712 toward CPU assembly 704, while memory modules 741-743 extend from memory support structure 745 of bank 722 away from CPU assembly 704. In this arrangement, routing flexibility is provided between memory banks and CPU 706 (FIG. 7), and there is negligible difference in the distances between the connections 751 and 752 respective to memory bank 712 and memory bank 722. Thus, design flexibility and high performance are both provided. In alternative embodiments, a pair of memory banks can be arranged face-to-face or both can be oriented in the same direction.

Figure 9:
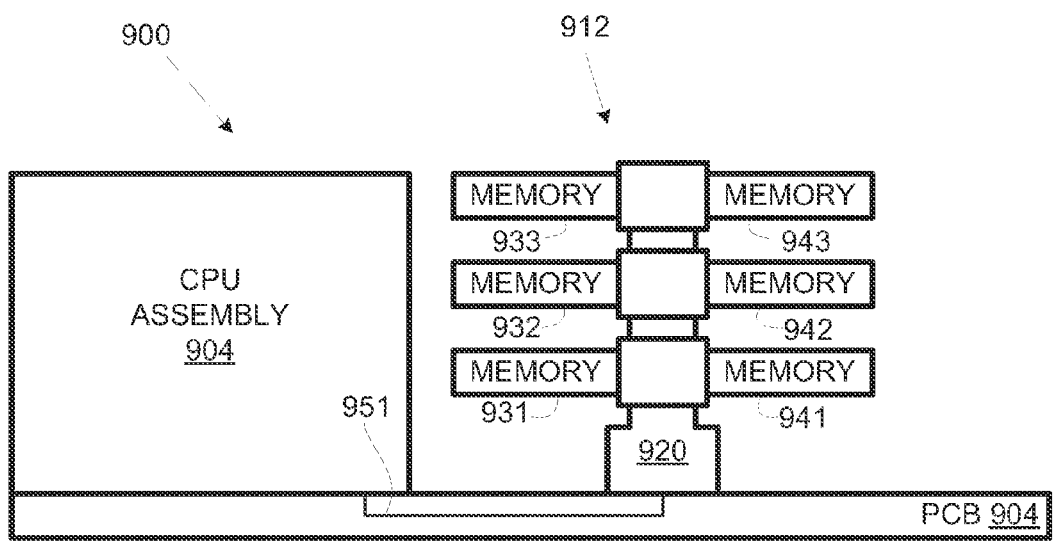
FIG. 9 is a schematic partial sectional view of a computer node having two-sided memory banks in accordance with an embodiment.

A computer node 900 having a two-sided memory bank 912 is shown in FIG. 9. Node 900 includes a PCB board 902 and a CPU assembly 904. Memory bank 912 includes a support structure 920 for memory modules 931-933, which extend toward CPU assembly 904, and memory modules 941-943, which extend away from CPU assembly 904. An electrical pathway 951 of PCB 902 provides CPU assembly 904 access to memory modules 931-933 and 941-943. Node 900 can include two, three, four or more such memory banks.

Herein, a "memory support structure" is a structure with features permitting a memory module to be installed so that it is physically and electrically connected to the support structure. Herein, a "memory module" is a module, such as a single-inline-memory module (SIMM) or dual-inline memory module (DIMM) having one or more integrated circuits in which most of the transistors are devoted to storing information in computer-readable form. Herein, a memory module has length, height, and depth dimensions in order of decreasing magnitude. Herein, "extending" is taken relative to a point of attachment; "extending toward" refers to extending from a point of attachment toward some other object such as a CPU assembly.

Herein, a "memory bank" is an assembly of a memory support structure with memory modules installed therein. Herein, "orthogonally" means "more orthogonal than parallel" and "parallel" means "more parallel than orthogonal". The dimensions in which a substrate extends are its length and width, while its depth dimension is orthogonal to the length and width dimensions. Herein, a "socket" is a feature for physically and electrically engaging a module so that the module can be installed. Herein, "substrate" encompasses PCBs and other structures used to physically support and electrically interconnect components such as CPUs and memory banks.

Herein, a "system" is a set of interacting elements, wherein the elements can be, by way of example and not of limitation, mechanical components, electrical elements, atoms, instructions encoded in storage media, and process segments. In this specification, related art is discussed for expository purposes. Related art labeled "prior art", if any, is admitted prior art. Related art not labeled "prior art" is not admitted prior art. The illustrated and other described embodiments, as well as modifications thereto and variations thereupon are within the scope of the following claims.

What is claimed is:

1. A system comprising:
   a substrate;
   a CPU assembly attached to said substrate, said CPU assembly including a CPU and a heat sink, said heat sink having a top located a first distance of more than 2.5 cm from said substrate:
   a first memory bank including a first memory support structure and memory modules installed therein, said first memory support structure extending to a second distance from said substrate within 20% of said first distance; and
   a second memory bank including a second memory support structure and memory modules extending parallel to said substrate and in a direction opposite from a direction in which the memory modules of said first memory bank extend;
   each of said first and second memory support structures being at least 2.5 cm tall and including,
      a base for physically and electrically connecting to said substrate so that each of said first and second memory support structures extend orthogonal to said substrate;
      sockets for receiving and engaging at least three memory modules concurrently so that the memory modules extend parallel to said substrate; and
      electrical pathways electrically connecting said sockets and said base so that a memory module inserted into one of said sockets is electrically connected to said substrate.

2. A system as recited in claim 1 wherein said memory modules include at least three memory modules at different respective distances from said substrate.

3. A system as recited in claim 1 wherein said first and second memory banks are on opposite sides of said CPU assembly.

4. A system as recited in claim 3 wherein said node further comprises third and fourth memory banks, said third memory bank being on the same side of said CPU assembly as said first memory bank, said fourth memory bank being on the same side of said CPU assembly as said second memory bank.

5. A system as recited in claim 4 wherein said first, second, third, and fourth memory banks are the same distance from said CPU assembly.

6. A process comprising:
   installing at least three memory modules in a memory support structure so that at least one of the memory modules extends parallel to and at least 2.5 cm from a substrate to which said memory support structure is attached;
   physically attaching and electrically connecting said memory support structure to said substrate so that said memory modules are aligned with respect to dimensions in which said substrate extends and distributed with respect to a dimension orthogonal to those dimensions, said attaching involving attaching at least first and second memory support structures on opposite sides of a CPU assembly mounted on said substrate; and wherein said installing includes installing memory modules in said first and second memory support structures so that the memory modules installed in said first memory support structure extend in a direction opposite to a direction in which the memory modules in said second memory support structure extend.

7. A process as recited in claim 6 wherein said attaching further includes:

attaching a third memory support structure to said substrate on the same side of said CPU assembly on which said first memory support structure is located; and attaching a fourth memory support structure to said substrate on the same side of said CPU assembly on which said second memory support structure is located so that said first, second, third, and fourth memory support structures are the same distance from said CPU assembly.

8. A process as recited in claim 7 wherein said installing involves inserting at least three memory modules into each of said memory supports.

9. A process as recited in claim 6 wherein said CPU assembly has a portion at a maximum distance from said substrate, at least one of said memory modules being installed so that it is within 20% of that distance from said substrate.

* * * * *

UNITED STATES PATENT AND TRADEMARK OFFICE
CERTIFICATE OF CORRECTION

PATENT NO. : 8,488,326 B2
APPLICATION NO. : 12/947473
DATED : July 16, 2013
INVENTOR(S) : Nguyen It is certified that error appears in the above-identified patent and that said Letters Patent is hereby corrected as shown below:

In the Claims

In column 4, line 20, in Claim 1, delete "substrate:" and insert -- substrate; --, therefor.

Signed and Sealed this
Eighth Day of October, 2013

Teresa Stanek Rea
*Deputy Director of the United States Patent and Trademark Office*